United States Patent
McLeod et al.

(10) Patent No.: US 8,921,221 B2
(45) Date of Patent: Dec. 30, 2014

(54) IMS (INJECTION MOLDED SOLDER) WITH TWO RESIST LAYERS FORMING SOLDER BUMPS ON SUBSTRATES

(75) Inventors: Mark H. McLeod, Poughkeepsie, NY (US); Jae-Woong Nah, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 749 days.

(21) Appl. No.: 13/164,728

(22) Filed: Jun. 20, 2011

(65) Prior Publication Data

US 2012/0318855 A1    Dec. 20, 2012

(51) Int. Cl.
- *H01L 21/44* (2006.01)
- *B23K 1/20* (2006.01)
- *B23K 3/06* (2006.01)
- *H01L 23/485* (2006.01)

(52) U.S. Cl.
CPC ............... B23K 1/20 (2013.01); B23K 3/0638 (2013.01)
USPC ............. 438/613; 257/E23.021; 257/E21.508

(58) Field of Classification Search
None
See application file for complete search history.

(56) References Cited

U.S. PATENT DOCUMENTS

| | | | |
|---|---|---|---|
| 7,291,517 B2 | 11/2007 | Sakurai | |
| 7,410,824 B2 | 8/2008 | Do | |
| 7,538,021 B2 | 5/2009 | Jomaa | |
| 7,569,164 B2 | 8/2009 | Sakurai | |
| 2008/0036100 A1* | 2/2008 | McWilliams et al. | 257/798 |
| 2010/0038644 A1* | 2/2010 | Song et al. | 257/59 |
| 2010/0116871 A1 | 5/2010 | Gruber | |

FOREIGN PATENT DOCUMENTS

GB    2194386 A  *  3/1988

OTHER PUBLICATIONS

Nah, J. W. (2003). A study on coining processes of solder bumps on organic substrates. IEEE Transactions on Electronics Packaging Manufacturing, 26(2), 166-172.*
P.A Gruber, et al."Low-cost wafer bumping". IBM J. Res. & Dev. Vol. 49 No. 4/5 Jul./Sep. 2005.
DuPont™ WBR 2000 Series (2008).
P.A Gruber, et al. "Direct IMS (Injection Molded Solder) Without a Mask for Forming Solder Bumps on Substrates" U.S. Appl. No. 12/706,212, filed Feb. 16, 2010.

* cited by examiner

*Primary Examiner* — Calvin Choi
(74) *Attorney, Agent, or Firm* — Louis J. Percello; Otterstedt, Ellenbogen & Kammer, LLP

(57) ABSTRACT

A photoresist layer is applied over a solder resist layer on a substrate such as a wafer. Openings in the solder resist and photoresist layers are filled with flux-free molten solder using IMS. The process is applicable to fine pitch applications and chip size packaging substrates. A protection layer may be employed to facilitate removal of the photoresist layer from the substrate. An oversized substrate including an adhesive layer on a peripheral area may be employed for providing greater adhesion of a dry film layer to the peripheral area of the substrate than the central portion thereof. The peripheral area is removed following IMS.

19 Claims, 8 Drawing Sheets

TOP VIEW

FIG. 2
(a) APPLICATION OF DRY FILM PHOTORESIST
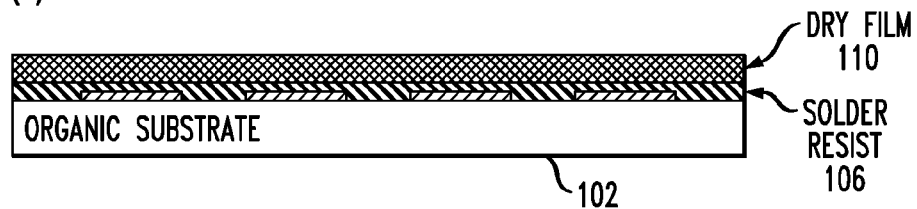
(b) FORM OPENINGS (e.g. PHOTOLITHOGRAPHY OR LASER DRILLING)
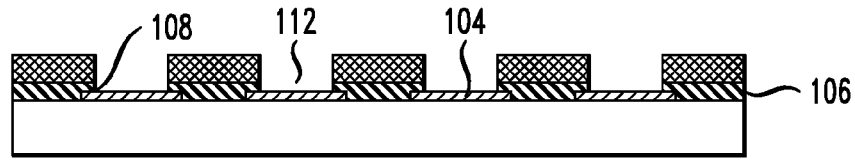
(c) IMS
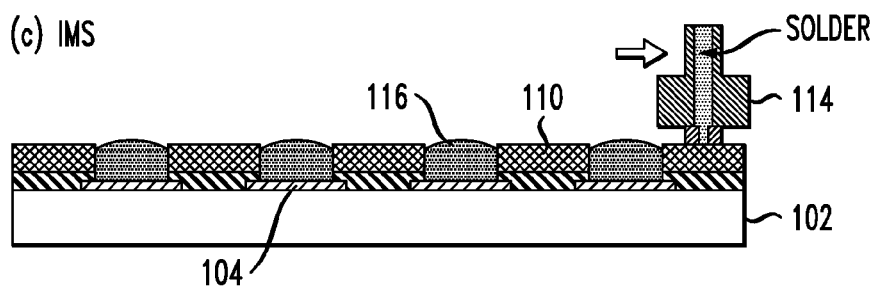
(d) REMOVE DRY FILM
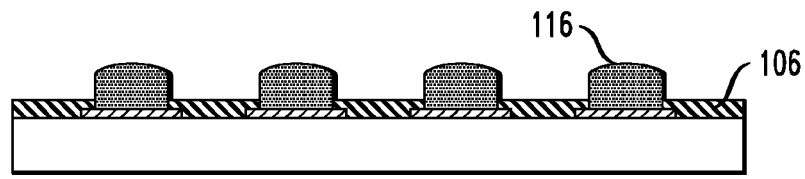
(e) REFLOW (OPTIONAL)
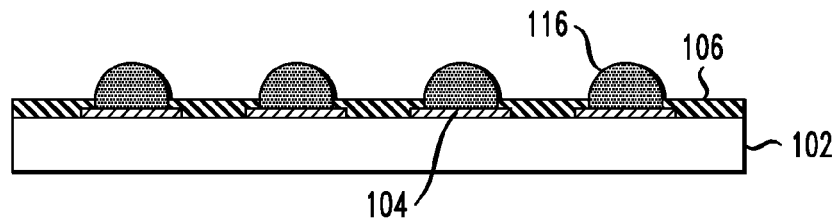

FIG. 3
(a) COATING OF SR
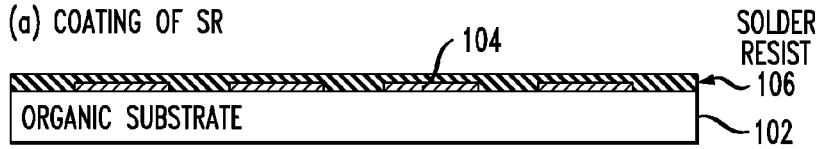
(b) COATING OF PROTECTION LAYER
(c) COATING DRY FILM
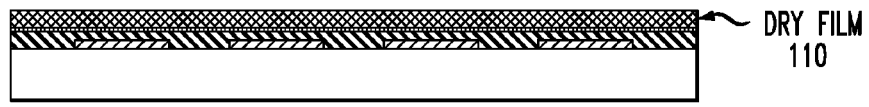
(d) OPENING (PHOTOLITHOGRAPHY OR LASER DRILLING)
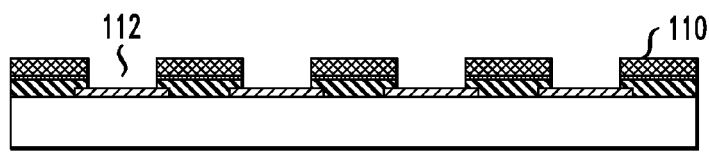
(e) IMS
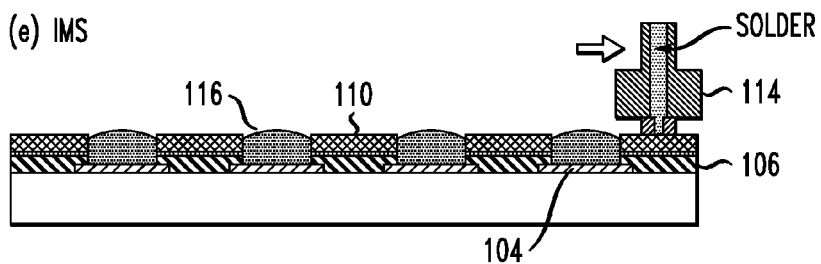
(f) REMOVE DRY FILM AND PROTECTION LAYER
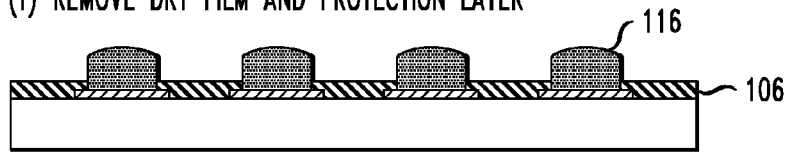
(g) REFLOW (OPTIONAL)
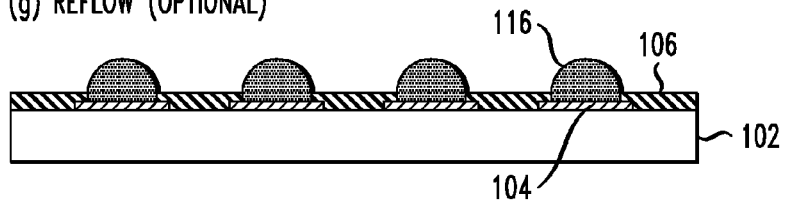

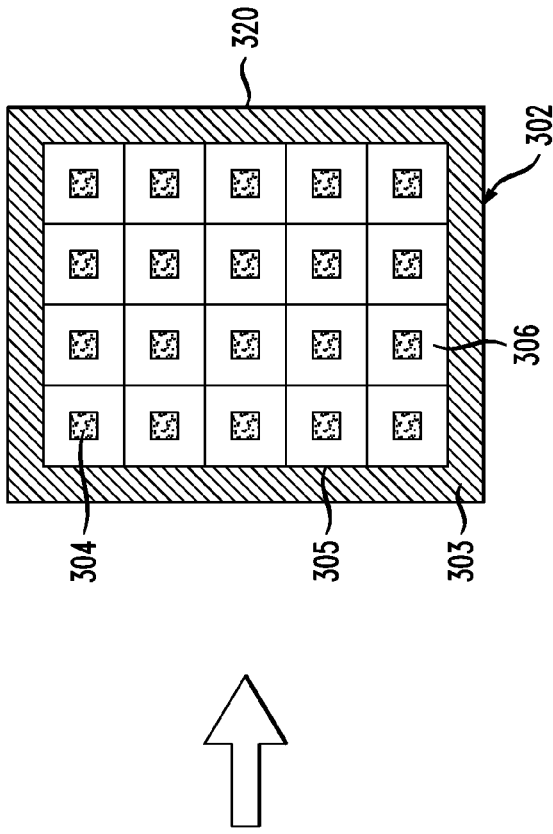
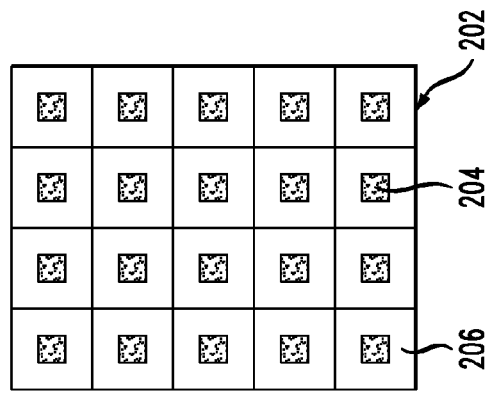
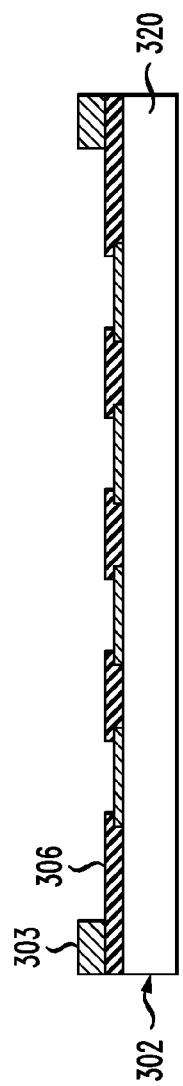

CSP (CHIP SIZE PACKAGING SUBSTRATE)

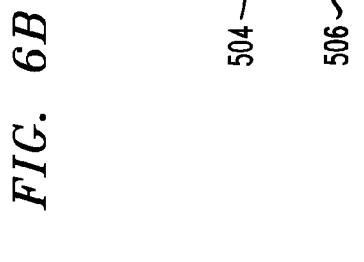
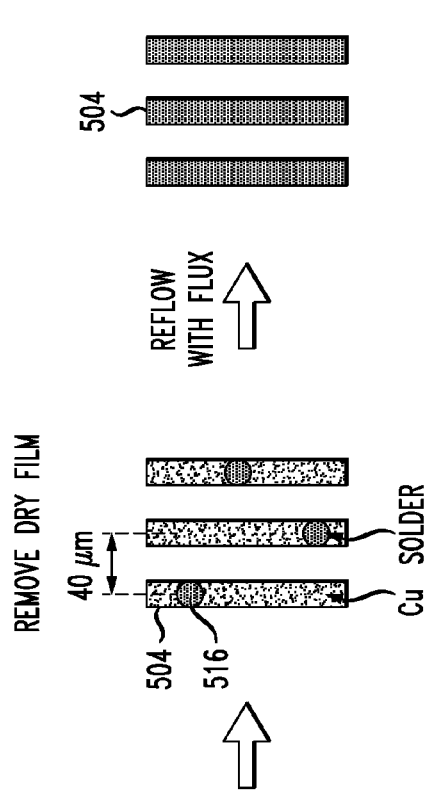
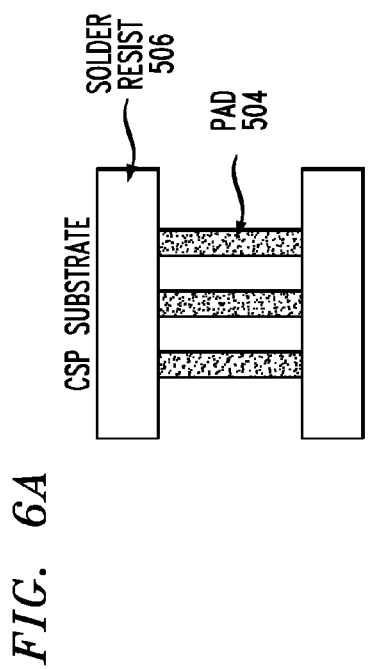
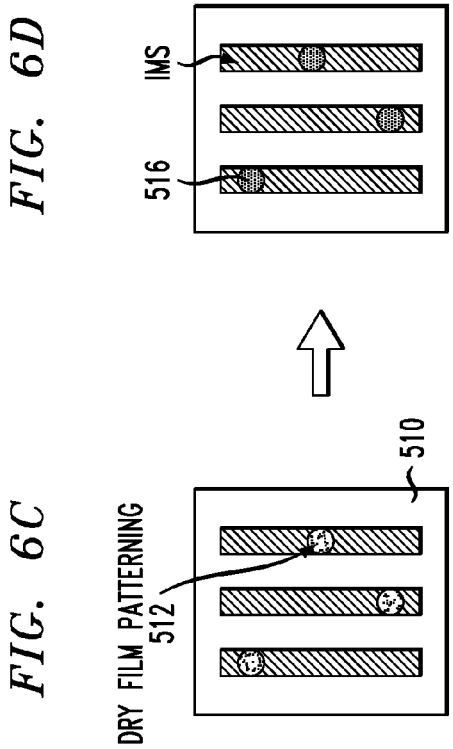

IMS (INJECTION MOLDED SOLDER) WITH TWO RESIST LAYERS FORMING SOLDER BUMPS ON SUBSTRATES

FIELD OF THE INVENTION

The present invention generally relates to the electrical and electronic arts and, more particularly, to injection molded solder deposition on substrates.

BACKGROUND OF THE INVENTION

J-W Nah et al., 'A Study on Coining Processes of Solder Bumps on Organic Substrates,' IEEE Transactions on electronics packaging manufacturing, Vol. 26, No. 2, April 2003, p. 166. shows a current high volume manufacturing method of forming solder bumps on laminates. The solder paste stencil printing method has been used for forming solder bumps on organic substrates for a long time. An organic substrate is provided with a plurality of pads and a solder resist layer. A stencil mask is aligned therewith. Solder paste is dispensed through the holes in the mask using a squeeze knife or blade. The mask is removed, leaving upstanding solder paste regions. Solder reflow causes the formation of rounded bumps with flux residue thereon. The residue is cleaned away leaving solder balls with a projecting height above the resist. In summary, solder paste is stencil printed through a mask aligned to the substrate solder resist (SR) openings. The mask enables deposition of solder paste material that stands above the SR after mask removal. However, commercial applications of the solder paste stencil printing method are limited to substrates with pitches greater than or equal to 150 microns because the high volume percentage of flux (around 50 volume %) in the solder paste hinders formation of high volume solder bumps without solder bridging.

U.S. Pat. No. 6,213,386 of Inoue et al., entitled 'Method of forming bumps,' discloses wherein solder balls and a tool having a large number of through-holes are used, and under the condition that the through-holes of the tool are aligned with the pads of the semiconductor device, the solder balls are charged into the through-holes, pressed to be fixed on the pads which have an adhesive such as flux, and then reflowed to form bumps.

A pre-formed solder ball mounting method for fine pitch applications under 150 microns pitch has been employed. An organic substrate is provided with a plurality of pads and a solder resist layer. A mask for flux is aligned therewith. Tacky flux is applied and the mask with adherent flux is removed, leaving flux portions on the pads. A mask for solder ball dispensing is aligned with the pads. Preformed solder balls are located in openings in the mask, in contact with the flux portions which retain them when the mask is removed. Reflow and flux cleansing are then performed. This so-called micro ball mounting method accordingly employs two masks, one to dispense tacky flux and the other to place preformed solder balls on the pads of the substrate. The tacky flux makes the balls stick to the bottoms of the SR openings during separation of the mask and before the reflow.

U.S. Pat. Nos. 7,291,517 and 7,569,164 disclose solder bumping methods wherein dry film resists are applied over solder resist layers, leaving electrodes on the substrate exposed. A solder paste composition fills the spaces defined by the solder resist and film over the electrodes. Solder balls are formed upon heating to an appropriate temperature. Because solder paste is comprised of solder powder and flux, the heights of the solder balls formed in such processes are likely to be less than the thickness of the film even though the powder and flux may initially be equal to the thickness of the film.

U.S. Pat. No. 7,410,824 describes a method in which a passivation layer on a chip has bond pad openings that expose UBM layers formed on bond pads. A film is formed and patterned to have openings centered over the bond pad openings. A metal stencil having openings is formed over the film. The stencil openings are larger than the openings in the film which are, in turn, larger than openings in the passivation layer. Solder paste is screen printed onto the UBM layers through the openings and reflowed to form solder balls. After the metal stencil is removed, the film is stripped from the substrate followed by a second reflow.

SUMMARY OF THE INVENTION

Principles of the present invention provide techniques for direct IMS (injection molded solder) for forming solder bumps on substrates. An exemplary method includes the step of obtaining an assembly comprising a substrate, a plurality of rows of electrically conductive contact pads on the substrate, a layer of solder resist on the substrate, and a plurality of first openings in the solder resist above and in fluid communication with the contact pads. The method further includes applying a dry film layer of photoresist on the layer of solder resist, forming a plurality of second openings in the dry film layer above and in fluid communication with the contact pads, and injecting flux-free molten solder into said first and second openings such that the molten solder interfaces with the contact pads and extends above the layer of solder resist. The solder is allowed to solidify and the dry film layer is removed from the layer of solder resist.

In another aspect, another exemplary method includes the steps obtaining a substrate including a plurality of rows of electrically conductive contact pads, applying a layer of solder resist to the substrate, and applying a dry film layer of photoresist to the substrate above the layer of solder resist. First openings are formed in the solder resist and second openings are formed in the dry film layer above the contact pads. The first openings and the second openings may be formed at one time. Flux-free molten solder is injected into the first and second openings such that the molten solder interfaces with the contact pads and extends above the layer of solder resist. The molten solder is allowed to solidify and the dry film layer is removed. The solder bumps formed in the process extend sufficiently above the remaining solder resist layer to perform their intended functions.

In accordance with a further exemplary embodiment, a method includes obtaining a chip size packaging substrate including a plurality of electrically conductive contact pads separated from each other by eighty microns or less and a solder resist layer on the substrate, the solder resist layer including an opening exposing a plurality of the contact pads. A dry film layer of photoresist is applied to the substrate above the contact pads and layer of solder resist followed by patterning to form a plurality of second openings, each of the second openings being in fluid communication with one of the contact pads. Flux-free molten solder is injected into the second openings and allowed to solidify. The dry film layer is then removed. The solder can be reflowed with flux following dry film removal, allowing the solder to wet on the contact pads.

A further exemplary embodiment includes obtaining an assembly comprising a substrate having a first area and a second area outside the first area, a plurality of rows of electrically conductive contact pads on the substrate, a layer of solder resist on the substrate, and a plurality of first openings in the solder resist above and in fluid communication with the contact pads, applying an adhesive layer to the second area of the substrate; and applying a photoresist layer on the layer of solder resist and the adhesive layer such that there is greater adhesion between the photoresist layer and the adhesive layer than between the photoresist layer and the layer of solder resist. A plurality of second openings is formed in the photoresist layer above and in fluid communication with the contact pads. Flux-free molten solder is injected into said first and second openings such that the molten solder interfaces with the contact pads and extends above the layer of solder resist. The molten solder is allowed to solidify. The second area of the substrate is cut away and the photoresist layer in the first area of substrate is easily removed, thereby providing an assembly including solder bumps for possible reflow thereafter.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

BRIEF DESCRIPTION OF THE DRAWINGS

FIG. 2 illustrates an alternative method including steps (a)-(e) for forming solder bumps on an organic substrate;

FIG. 3 illustrates a further alternative method including steps (a)-(g) for forming solder bumps on an organic substrate;

FIGS. 4A and 4B illustrate substrates that may be employed when an adhesive layer is used in an extra area of the panel size substrate beneath a dry film;

FIGS. 4C-4I illustrate a method for forming solder bumps using an oversized panel;

FIGS. 6A-6F schematically depict a method of solder bumping a CSP substrate having a fine pitch, and FIGS. 7A-7C schematically illustrate certain steps of the method shown in FIGS. 6A-6F.

DETAILED DESCRIPTION OF PREFERRED EMBODIMENTS

Aspects of the invention relate to the injection molded solder (IMS) process for forming solder bumps on the pads of package substrates. The invention facilitates one or more of 1) producing bumps having sufficient height without modifying the solder resist opening design, 2) producing bumps in fine pitch applications, 3) applying solder to chip scale packaging substrates.

Initially, the complete disclosure of U.S. Patent Application Publication U.S. 2010/0116871 of Gruber et al., filed Nov. 12, 2008, entitled "Injection Molded Solder Method for Forming Solder Bumps on Substrates" ("the Gruber et al. application") is expressly incorporated herein by reference in its entirety for all purposes. The Gruber et al. application discloses a method for forming solder bumps on wettable contact pads using IMS. The pads are formed on organic substrates such as laminate materials made of glass fibers in an epoxy; for example, FR-4 (flame retardant type 4) and BT-resin (Bismaleimide Triazine resin). Alternatively, inorganic substrates such as silicon wafers may be employed. The wettable pads can be an electrically conductive material such as copper, gold or nickel and, in the case of a silicon substrate, ball-limiting metallurgy (BLM). A fill head is employed for depositing solder and wiping away excess solder as the cavities are filled. Substrates, contact pads and solder fill heads as disclosed by the Gruber et al. application can be employed in accordance with exemplary embodiments of the invention.

Figure 1A:
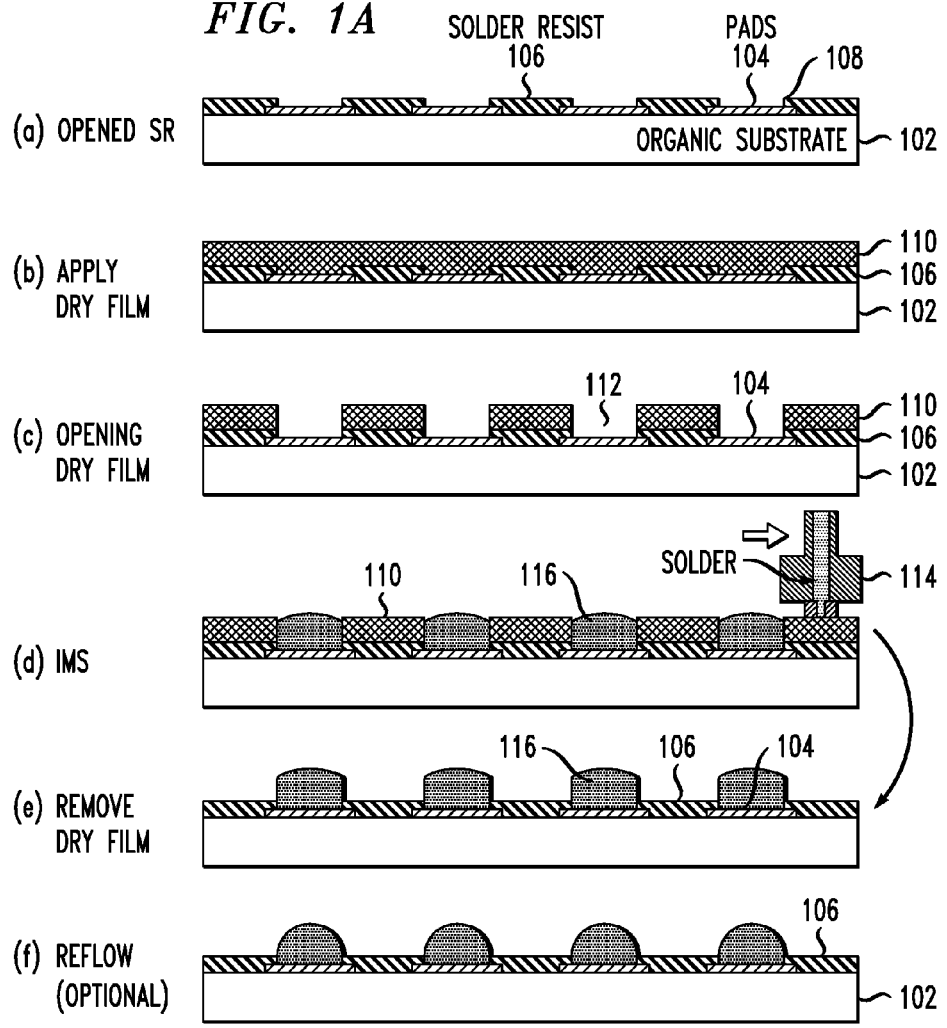
FIG. 1A schematically illustrates a method including a sequence of steps (a)-(f) for forming solder bumps on an organic substrate.

Referring FIG. 1A, a series (a)-(f) of steps is provided in accordance with a first exemplary and preferred embodiment for producing solder bumps of desired height. A substrate 102 including a plurality of rows of electrically conductive, wettable contact pads 104, a layer of cured solder resist 106 and openings 108 in the solder resist is obtained. Such an assembly can be obtained by depositing the layer of solder resist followed by patterning and etching to expose the contact pads or by securing a pre-manufactured assembly as shown in step (a) and FIG. 1B, In this exemplary embodiment, the substrate 102 is organic, the contact pads are copper, and the solder resist is a suitable polymeric material that prevents solder from bridging between conductors. Solder resists comprising photo-polymers are well known in the art.

A dry film 110 of photoresist is applied to the substrate above the solder resist layer as shown in step (b) of FIG. 1A. Dry films 57 that exhibit heat resistance exceeding 300° C. reflow temperatures are commercially available and are applied using a pressurized hot roll. Photoresist, which provides uniform photoresist thickness on a substrate and is available in thicknesses ranging from 20-50 μm, may be employed in conjunction with one or more embodiments of the invention. Dry films having thicknesses outside this range may be employed depending on the size of the solder bumps to be formed on the contact pads. Openings 112 are formed in the dry film 110 by patterning followed by etching or laser drilling after cure of dry film as shown in step (c). The openings 112 may have the same or larger dimensions as the openings 108 in the solder resist in this exemplary embodiment and may be smaller than the dimensions of the contact pads 104 that they overlie. The opening size of dry film depends on the thickness of dry film and desired solder volume on a pad in a substrate. Optionally, if required, a dry film may be cured by heat treatment in an oven before molten solder injection and after opening.

A solder fill head 114 moves translationally with respect to the substrate 102 during the IMS process shown in FIG. 1A, step (d). Such movement may be provided by moving the fill head with respect to the substrate as shown or by moving the substrate while maintaining the fill head in a stationary position. Molten flux-free solder is injected into the openings 112 and preferably completely fills the openings 108, 112 above the contact pads 104 so that it is level with the top surface of the dry film 110. The solder is at least filled to a level higher than the thickness of the solder resist layer 106, allowing the formation of solder bumps 116 of desired height. The IMS process and solder solidification are preferably conducted in a low oxygen environment, preferably less than 10,000 ppm in a nitrogen environment. Alternatively, a forming gas environment including nitrogen and hydrogen may be employed (e.g. 90% $N_2$, 10% $H_2$). Step (d) shows the solder bumps 116 following solidification, the bumps having rounded top ends that extend above the top surface of the dry film 110. There is substantially no shrinkage of the solder volume during the process. The dry film 110 is removed following solder solidification to produce the structure shown in step (e). An optional reflow step (f) may then be conducted.

FIG. 2 shows steps (a)-(e) of an alternative embodiment of a method according to the invention. An organic substrate 102 including rows of electrically conductive, wettable contact pads 104 is provided. As shown in step (a), a layer of solder resist 106 is applied to the substrate followed by a layer of dry film 110. Using photolithographical processes or laser drilling, openings 108,112 are formed in the solder resist layer and dry film layer, respectively. Steps (c)-(e) of FIG. 2 are then performed in the same manner described above with respect to steps (d)-(f) of FIG. 1A.

FIG. 3 shows steps (a)-(g) of a further alternative embodiment of a method according to the invention. In step (a), a layer of solder resist 106 is applied to the substrate 102 and cured. A protection layer 103 is then applied to the solder resist in step (b). The protection layer 103 is provided for facilitating the later removal of the dry film 110 from the solder resist 106, which is applied in step (c). If the dry film tends to stick on the solder resist following the IMS process, the protection layer can reduce or prevent the potential problem of a residue remaining on the solder resist. This layer 103 is preferably only a few microns in thickness and is preferably easily patterned during photolithography or laser drilling Openings are then formed in the three layers by photolithography and/or laser drilling so that the contact pads 104 are exposed to provide the structure shown in step (d). A solder fill head 114 deposits flux-free molten solder into the openings in a low oxygen environment, forming the structure shown in step (e) of FIG. 3 following solidification in a low oxygen environment. The dry film and protection layer are removed by etching or other suitable process, as shown in step (f). Heat may be applied to effect solder reflow in step (g).

Figure 1B:
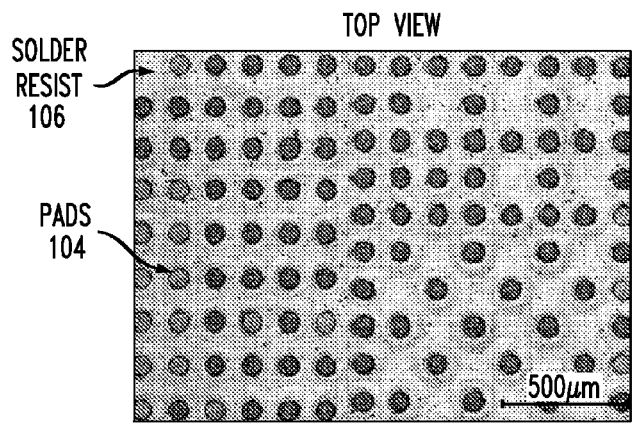
FIG. 1B is a top view of the substrate corresponding to step (a) in FIG. 1A.

FIG. 4A shows a top view of a substrate 202 including rows of contact pads 204 exposed by openings in a layer of solder resist 206, similar to the embodiment of FIG. 1B. Adhesive layer can be applied over a extra area using such a substrate, thereby providing enough adhesion between dry film and solder resist during IMS process and facilitating later removal of the dry film and eliminating the possibility of dry film layer residue remaining on the substrate. By enlarging the size of the substrate 302 as shown in FIG. 4B, the dry film can be firmly adhered to the substrate while reducing or eliminating residue from either the dry film or an added protection layer on the substrate. An adhesive layer 303 is applied only to the peripheral area 320 outside the area 305 containing the contact pads 304 and associated circuitry and overlying solder resist 306. This area 305 corresponds to the ordinary size of the substrate 202 shown in FIG. 4A. Following application of the adhesive layer 303, a dry film resist layer (not shown) is applied to the entire substrate 302. The resist layer is patterned to form a structure similar to that shown in step (c) of FIG. 1A. An IMS process is conducted, preferably in a low oxygen environment, once the openings are formed in the resist layer. The solder is solidified, preferably in the low oxygen environment, and the dry film removed from the substrate. The use of the adhesive layer 303 facilitates such removal as described below. No residue from the adhesive layer 303 will be remaining on the area 305 of the substrate containing the contact pads and solder resist 306. The portion of the substrate 302 comprising the extra area 320 is then removed, leaving an assembly of desired size. While the peripheral area 320 on which the protection layer is deposited preferably surrounds the entire area 305 containing the contact pads and associated circuitry, such an area can extend on only one or two sides of the area 305. Because the adhesive layer 303 in this embodiment does not need to be amenable to photolithography or laser drilling and is entirely removed by cutting the wafer, it may be made from a wide variety of materials, including both metal and polymer films.

Figure 4D:
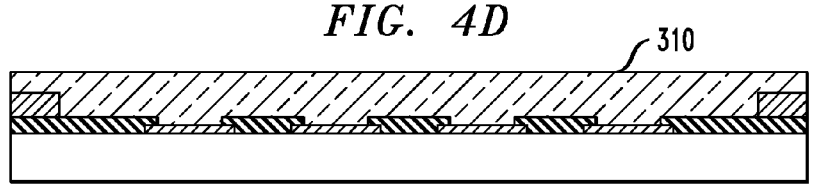
Figure 4E:
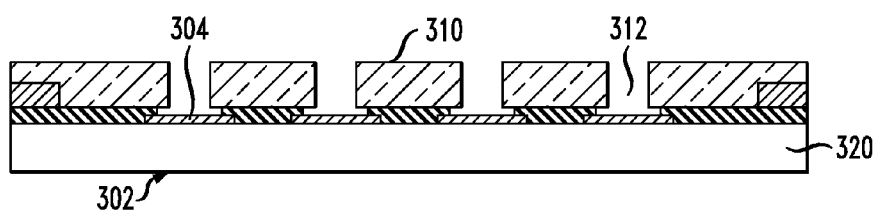
Figure 4F:
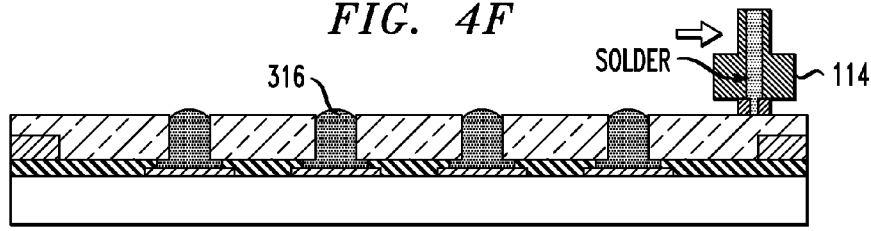
Figure 4G:
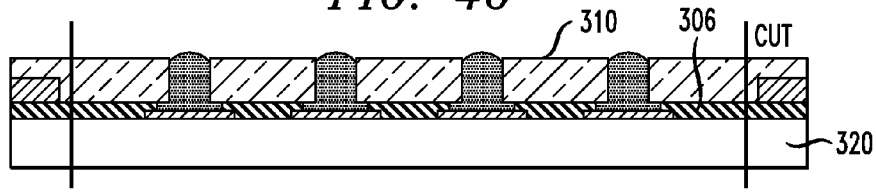
Figure 4H:
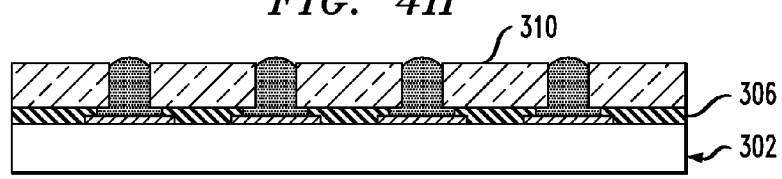
Figure 4I:
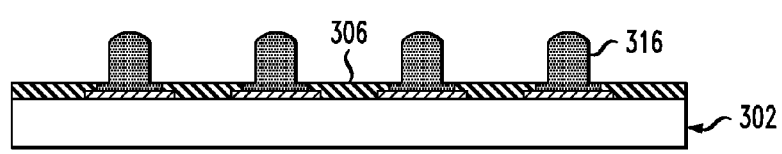

FIGS. 4C-4I show an exemplary method using the enlarged substrate 302 shown in FIG. 4B. A dry film is strongly adhered to the extra peripheral area 320 which will be cut away after IMS. It is weakly adhered to the inner area 305 that includes the contact pads 304. When the dry film is laminated on a panel size substrate, higher temperature and higher pressure can be applied in the extra peripheral area than in the inner area 305. As shown in FIG. 4C, the adhesive layer 303 is preferably applied to the peripheral area 320 of the enlarged substrate 302. The thickness of the adhesive layer is exaggerated in the drawing for purposes of illustration. Its thickness can contribute to the pressure exerted by the hot roll (not shown) on the peripheral area 320 of the substrate used to apply the dry film. A hot roll moving over the entire substrate will exert more pressure on the peripheral area 320 than the inner area, facilitating lamination of the dry film to the peripheral area. The adhesive layer preferably exhibits greater adhesion to the dry film than does the solder resist layer 306, further contributing to the difference in adhesion between the peripheral and inner areas of the substrate. The relatively strong adhesion of the dry film to the peripheral area helps ensure that the dry film layer will not be displaced relative to the substrate during IMS despite the relatively weak adhesion to the solder resist layer 306. A dry film 310 of photoresist is applied to the solder resist layer 306 forming the structure shown in FIG. 4D. The dry film is then patterned to form openings 312 communicating with the metal contact pads 304, as shown in FIG. 4E. A solder fill head 114 traverses the dry film in the IMS process shown in FIG. 4F, preferably in a nitrogen atmosphere. (The dry film may be cured by heat treatment prior to the IMS process.) After cutting the extra area 320 as shown in FIG. 4G, including the dry film 310 thereon, a structure as shown in FIG. 4H is provided. The dry film is removed from the substrate, resulting in the structure including solder bumps 316 as shown in FIG. 4I. The relatively weak lamination of the dry film to the solder resist facilitates such removal. Reflow (not shown) may follow this step.

Figure 5A:
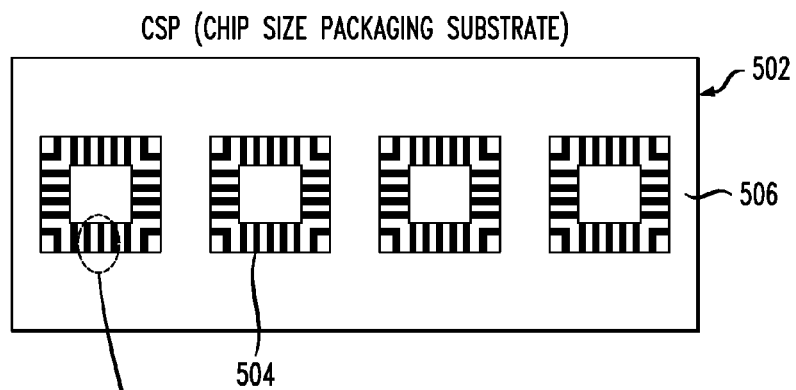
FIGS. 5A-5C illustrate a chip size packaging (CSP) substrate and selection portions thereof.
Figure 5B:
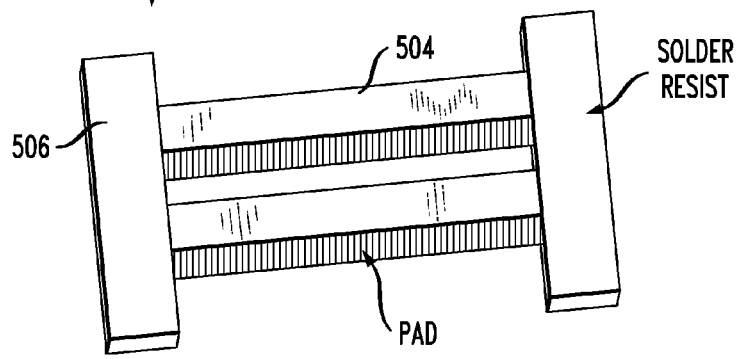
Figure 5C:
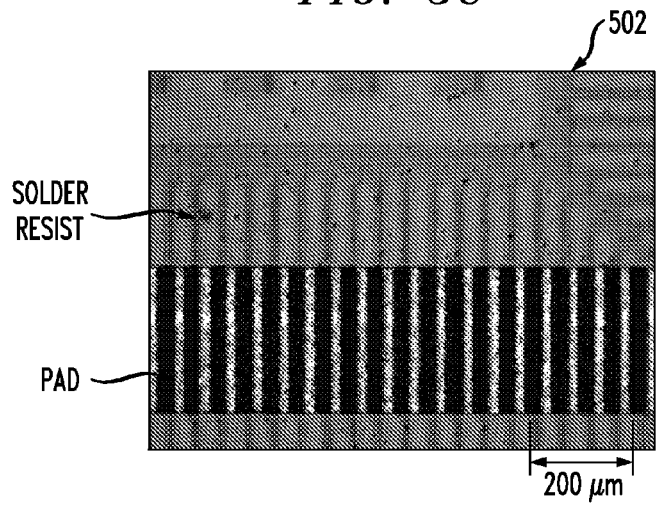
Figure 7A:
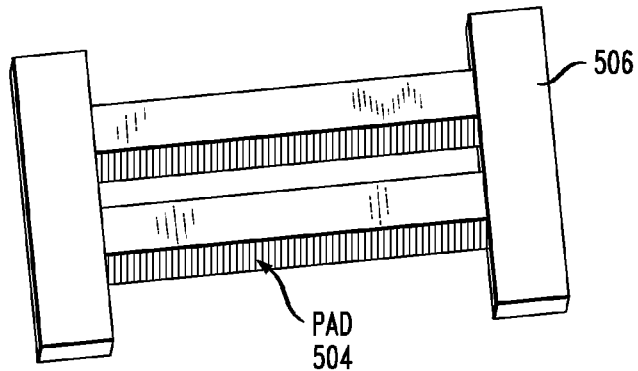
Figure 7B:
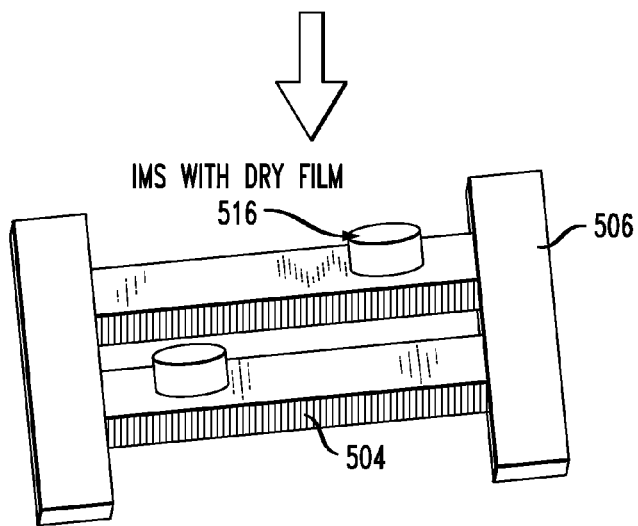
Figure 7C:
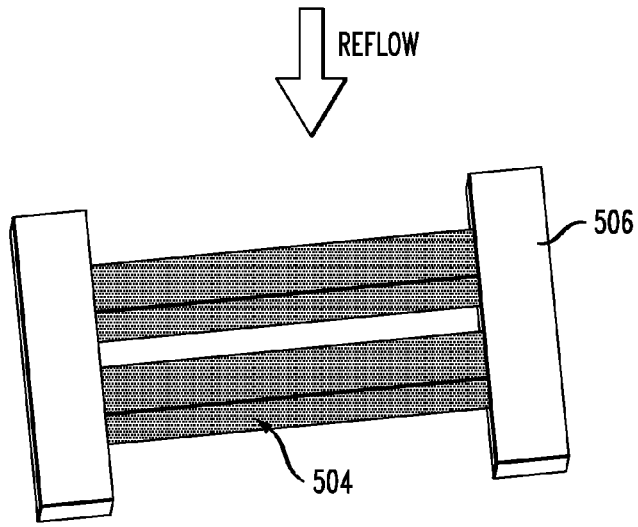

FIGS. 5A-5C schematically illustrate the application of the principles of the invention to chip size packaging substrates. In this exemplary embodiment, the substrate 502 includes a layer of solder resist 506 and exposed contact pads 504. The spacing of the contact pads in this embodiment is less than 80 μm. Because it is difficult to provide openings in the solder resist similar to those shown in FIG. 1A in such fine pitch applications, wide areas of solder resist are opened to expose a plurality of contact pads 504. Referring to FIG. 6A, a greatly enlarged view of a portion of the assembly shows three copper contact pads 504 extending between portions of a solder resist layer 506. A dry film 510 of resist is applied, covering the contact pads 504 and solder resist as shown in FIG. 6B. The dry film is then patterned, forming openings 512 in the dry film above the contact pads. As shown, a zigzag pattern of openings is formed as shown in FIG. 6C. The openings 512 accordingly have a larger pitch than that of the contact pads. In this exemplary embodiment, the contact pad pitch is about 40 μm while the pitch of the openings 512 is about 130 μm. FIG. 6D depicts an IMS process wherein the openings 512 are filled with flux-free solder, forming solder bumps 516. The dry film is removed as shown in FIG. 6E, leaving the solder bumps 516 in a zigzag pattern on the contact pads 504. The solder can then be reflowed with flux, allowing the solder to wet on the contact pads as shown in FIG. 6F. Solder bridging is not a problem as the solder deposited though IMS only wets on the copper contact pads 504. FIGS. 7A-7C provide enlarged, perspective views of three of the steps described above with respect to FIGS. 6A-F. The dry film 510 can be applied over the entire substrate 502 such that it extends over all of the openings in the solder resist 506 and the contact pads 504 exposed by the openings.

One or more embodiments of the invention may employ almost any kind of solder, although very high melting temperature solder such as 97Pb3Sn may not be desirable for reasons as set forth below. Eutectic SnPb (37Pb63Sn) and Pb-free solder (pure Sn, SnAgCu, SnAg, SnCu, SnBi, SnIn, etc.) are non-limiting examples of suitable solders. The melting temperature of 97Pb3Sn is 320° C., so the organic substrate could be decomposed if using same, even though the time for molten solder injection is short. Any types of solders which have melting temperatures below 285° C. are believed to be particularly advantageous. When the solder is injected, the temperature of solder is above its melting temperature. The oxygen concentration in the nitrogen environment of all embodiments described above is preferably less than 10,000 ppm to form structures as shown by way of example in FIGS. 1A, step (d), FIG. 2, step (c) and FIG. 3, step (e).

In some instances, the step of directly injecting the molten solder is carried out with an injection molded solder fill head 114, and the fill head comprises compliant material (not shown) interposed between the fill head and the dry film layer to accommodate topographical features of the solder resist and reduce spillage.

In some instances, following the solidification step, the solder bumps extend above the outer surface of the solder resist layer by about 15 microns about 70 microns.

Given the discussion thus far, it will be appreciated that, in general terms, an exemplary method, according to an aspect of the invention, includes obtaining an assembly comprising a substrate, a plurality of rows of electrically conductive contact pads on the substrate, a layer of solder resist on the substrate, and a plurality of first openings in the solder resist above and in fluid communication with the contact pads. FIGS. 1A and 1B show an exemplary assembly. The method further includes applying a dry film layer of photoresist on the layer of solder resist and forming a plurality of second openings in the dry film layer above and in fluid communication with the contact pads. Steps (b) and (c) shown in FIG. 1A show the application of dry film 110 and forming "second" openings 112, respectively. Flux-free molten solder is injected into the first and second openings such that the molten solder interfaces with the contact pads and extends above the layer of solder resist. As shown in step (d) of FIG. 1A, the IMS step provides solder bumps 116 that extend above the layer 106 of solder resist. In this exemplary embodiment, the solder through surface tension forms solder bumps that also extend above the layer of dry film 110. The molten solder is allowed to solidify, forming the solder bumps 116 as shown in step (d) of FIG. 1A and the dry film layer is removed from the layer of solder resist as shown in step (e).

An exemplary method in accordance with a further aspect of the invention includes the steps of obtaining a substrate including a plurality of rows of electrically conductive contact pads and applying a layer of solder resist to the substrate. The exemplary embodiment of FIG. 3, step (a) illustrates such steps wherein solder resist 106 is coated on a substrate 102 having contact pads 104. A dry film layer of photoresist is applied to the substrate above the layer of solder resist such as illustrated in step (c) of FIG. 3. First openings in the solder resist and second openings in the dry film layer above the contact pads are formed as shown by way of example as step (d) of FIG. 3. The method further includes injecting flux-free molten solder into the first and second openings such that the molten solder interfaces with the contact pads and extends above the layer of solder resist, allowing the molten solder to solidify, and removing the dry film layer. Steps (e) and (f) of FIG. 3 show such steps.

A further exemplary method includes obtaining a chip size packaging substrate including a plurality of electrically conductive contact pads and a solder resist layer on the substrate, the solder resist layer including an opening exposing a plurality of the contact pads. FIG. 5A shows such a packaging substrate 502 while FIG. 5C shows a portion of the substrate including a plurality of exposed contact pads. The exemplary method further includes applying a dry film layer of photoresist to the substrate above the contact pads and layer of solder resist and patterning the dry film layer of photoresist to form a plurality of second openings, each of the second openings being in fluid communication with one of the contact pads. FIGS. 6B and 6C show the application of dry film 510 and subsequent patterning to form openings 512. Flux-free molten solder is injected into the second openings such as illustrated in FIG. 6D. The molten solder is allowed to solidify and the dry film layer is removed, as shown in FIG. 6E.

A further exemplary method includes obtaining an assembly comprising a substrate having a first area and a second area outside the first area, a plurality of rows of electrically conductive contact pads on the substrate, a layer of solder resist on the substrate, and a plurality of first openings in the solder resist above and in fluid communication with the contact pads. As discussed above. FIGS. 4B and 4C show an oversize substrate having a first area 305 including rows of contact pads 304, a solder resist layer 306 having openings above the contact pads, and a second area 320 outside the first area. The method further includes applying an adhesive layer to the second area of the substrate, applying a photoresist layer on the layer of solder resist and the adhesive layer such that there is greater adhesion between the photoresist layer and the adhesive layer than between the photoresist layer and the layer of solder resist, and forming a plurality of second openings in the photoresist layer above and in fluid communication with the contact pads. FIG. 4C shows the application of an adhesive layer 303 to the second area 320 of the substrate. FIG. 4D shows the application of a photoresist layer 310 on the solder resist layer and the adhesive layer 303. The formation of openings 312 in the photoresist layer is shown in FIG. 4E. As shown in FIG. 4F. flux-free molten solder is injected into the first and second openings such that the molten solder interfaces with the contact pads and extends above the layer of solder resist. The molten solder is allowed to solidify, the second area 320 of the substrate is removed such as by cuts as shown in FIG. 4G. The photoresist layer 310 is removed from the layer of solder resist 306 forming a structure such as shown in FIG. 4I.

The methods described above can be used in the fabrication and packaging of integrated circuit chips; in particular, techniques set forth herein can be used to make arrays of solder bumps for attachment to an integrated circuit chip. The chip design can be created, for example, in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design can then be converted into an appropriate format such as, for example, Graphic Design System II (GD-SII), for the fabrication of photolithographic masks, which typically include multiple copies of the chip design in question that are to be formed on a wafer. The photolithographic masks can be utilized to define areas of the wafer (and/or the layers thereon such as the resist layers) to be patterned or etched or otherwise processed.

Resulting integrated circuit chips can be distributed by the fabricator in raw wafer form (that is, as a single wafer that has multiple unpackaged chips), as a bare die or in a packaged form. In the latter case, the chip can be mounted in a single chip package (such as a plastic carrier, with leads that are affixed to a mother board or other higher level carrier) or in a multi-chip package (such as a ceramic carrier that has either or both surface interconnections or buried interconnections). In any case, the chip may then be integrated with other chips, discrete circuit elements and/or other signal processing devices as part of either (a) an intermediate product, such as a mother board, or (b) an end product. The end product can be any product that includes integrated circuit chips, ranging from toys and other low-end or consumer electronic applications to advanced computer products, having a display, a keyboard or other input device, and a central processor. The techniques set for the herein can be used for interconnecting the chip on chips or chip stacks for 3D applications, chips on wafers, chips on package or package on package.

It will be appreciated and should be understood that the exemplary embodiments of the invention described above can be implemented in a number of different fashions. Given the teachings of the invention provided herein, one of ordinary skill in the related art will be able to contemplate other implementations of the invention.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

What is claimed is:

1. A method comprising the steps of:
    obtaining an assembly comprising a substrate, a plurality of rows of electrically conductive contact pads on the substrate, a layer of solder resist on the substrate, and a plurality of first openings in the solder resist above and in fluid communication with the contact pads;
    applying a dry film layer of photoresist on the layer of solder resist;
    forming a plurality of second openings in the dry film layer above and in fluid communication with the contact pads;
    injecting flux-free molten solder into said first and second openings such that the molten solder interfaces with the contact pads and extends above the layer of solder resist;
    allowing the molten solder to solidify;
    removing the dry film layer from the layer of solder resist; and
    curing the dry film layer by heat treatment prior to injecting flux-free molten solder into the first and second openings, wherein the dry film layer has a relatively strong adhesion to a peripheral area of the substrate relative to an inner area of the substrate including the contact pads.

2. The method of claim 1, further including the step of passing a filling head containing the molten solder over the dry film layer and causing the filling head to inject sufficient molten solder that the molten solder completely fills the second openings in the dry film.

3. The method of claim 1, further including providing a protection layer between the solder resist and the dry film layer.

4. The method of claim 1, wherein the substrate is a chip size packaging substrate and each first opening in the solder resist exposes a plurality of the contact pads and each second opening in the dry film layer exposes one of the contact pads.

5. The method of claim 4, wherein the second openings in the dry film layer are formed in a zigzag pattern.

6. The method of claim 1, further including reflowing the solder with flux following removal of the dry film.

7. The method of claim 1, further including providing a protection layer only to a first area of the substrate inside a second area of the substrate.

8. A method comprising:
    obtaining a substrate including a plurality of rows of electrically conductive contact pads;
    applying a layer of solder resist to the substrate;
    applying a dry film layer of photoresist to the substrate above the layer of solder resist;
    forming first openings in the solder resist and second openings in the dry film layer above the contact pads;
    injecting flux-free molten solder into the first and second openings such that the molten solder interfaces with the contact pads and extends above the layer of solder resist;
    allowing the molten solder to solidify;
    removing the dry film layer; and
    curing the dry film layer and solder resist by heat treatment prior to injecting flux-free molten solder into the first and second openings, wherein the dry film layer has a relatively strong adhesion to a peripheral area of the substrate relative to an inner area of the substrate including the contact pads.

9. The method of claim 8, further including providing a protection layer between the layer of solder resist and the dry film layer and forming a plurality of third openings in the protection layer above the contact pads.

10. The method of claim 9, further including removing the protection layer following solidification of the solder.

11. The method of claim 8, further including the step of passing a filling head containing the molten solder over the dry film layer and causing the filling head to inject sufficient molten solder that the molten solder completely fills the first openings in the layer of solder resist and the second openings in the dry film.

12. A method comprising:
    obtaining a chip size packaging substrate including a plurality of electrically conductive contact pads and a solder resist layer on the substrate, the solder resist layer including an opening exposing a plurality of the contact pads;
    applying a dry film layer of photoresist to the substrate above the contact pads and layer of solder resist;
    patterning the dry film layer of photoresist to form a plurality of second openings, each of the second openings being in fluid communication with one of the contact pads;
    injecting flux-free molten solder into the second openings;
    allowing the molten solder to solidify;
    removing the dry film layer; and
    curing the dry film layer by heat treatment prior to injecting flux-free molten solder into the second openings, wherein the dry film layer has a relatively strong adhesion to a peripheral area of the substrate relative to an inner area of the substrate including the contact pads.

13. The method of claim 12, wherein the contact pads are separated from each other by eighty microns or less and the second openings are formed in a zigzag pattern.

14. The method of claim 12, further including reflowing the solder with flux after removing the dry film layer.

15. The method of claim 12, wherein said substrate comprises an organic substrate and the contact pads are separated from each other by eighty microns or less.

16. The method of claim 12, wherein the solder resist layer includes a plurality of openings, including the opening exposing the plurality of the contact pads, each of the openings in the solder resist layer exposing a plurality of contact pads, further including applying the dry film layer of photoresist over all the openings in the solder resist layer.

17. A method comprising:
   obtaining an assembly comprising a substrate having a first area and a second area outside the first area, a plurality of rows of electrically conductive contact pads on the substrate, a layer of solder resist on the substrate, and a plurality of first openings in the solder resist above and in fluid communication with the contact pads;
   applying an adhesive layer to the second area of the substrate;
   applying a dry film layer of photoresist on the layer of solder resist and the adhesive layer such that there is greater adhesion between the dry film layer and the adhesive layer than between the dry film layer and the layer of solder resist;
   forming a plurality of second openings in the dry film layer above and in fluid communication with the contact pads;
   injecting flux-free molten solder into said first and second openings such that the molten solder interfaces with the contact pads and extends above the layer of solder resist;
   allowing the molten solder to solidify;
   removing the second area of the substrate;
   removing the dry film layer from the layer of solder resist; and
   curing the dry film layer by heat treatment prior to injecting flux-free molten solder into the first and second openings, wherein the dry film layer has a relatively strong adhesion to a peripheral area of the substrate relative to an inner area of the substrate including the contact pads.

18. The method of claim 17, wherein the second area of the substrate defines a peripheral portion extending entirely around the first area.

19. The method of claim 17, further including the step of passing a filling head containing the molten solder over the dry film layer and causing the filling head to inject sufficient molten solder that the molten solder completely fills the second openings in the photoresist dry film layer.

* * * * *